United States Patent
Wright et al.

(10) Patent No.: US 6,893,967 B1
(45) Date of Patent: May 17, 2005

(54) L-SHAPED SPACER INCORPORATING OR PATTERNED USING AMORPHOUS CARBON OR CVD ORGANIC MATERIALS

(75) Inventors: Marilyn I. Wright, Sunnyvale, CA (US); Douglas J. Bonser, Austin, TX (US); Lu You, San Jose, CA (US); Kay Hellig, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/755,911

(22) Filed: Jan. 13, 2004

(51) Int. Cl.⁷ .............................................. H01L 29/72
(52) U.S. Cl. ........................ 438/691; 438/692; 438/694; 257/333; 257/401
(58) Field of Search ........................... 438/691, 692, 438/694; 257/333, 401

(56) References Cited

U.S. PATENT DOCUMENTS

2002/0179982 A1 * 12/2002 Cheng et al. ............... 257/401
2004/0072435 A1 * 4/2004 Quek .......................... 438/691

* cited by examiner

Primary Examiner—Edward Wojciechowicz
(74) Attorney, Agent, or Firm—Foley & Lardner LLP

(57) ABSTRACT

A multilayer L-shaped spacer is formed of a lower portion comprising a CVD organic material or amorphous carbon, and an upper portion comprised of a protective material. The upper portion is patterned using a photoresist mask. During that patterning, the underlying substrate is protected by a layer of CVD organic material or amorphous carbon. The CVD organic material or amorphous carbon is then patterned using the patterned protective material as a mask. The chemistry used to pattern the CVD organic material or amorphous carbon is relatively harmless to the underlying substrate. Alternatively, an L-shaped spacer is patterned without using a photoresist mask by forming an amorphous carbon spacer around a gate that is covered with a conformal layer of a conventional spacer material. The conventional spacer material is patterned using the amorphous carbon spacer as an etch mask. The amorphous carbon spacer is easily formed without the need for lithographic patterning, and therefore this method is preferable to methods using photoresist masks.

16 Claims, 7 Drawing Sheets

L-SHAPED SPACER INCORPORATING OR PATTERNED USING AMORPHOUS CARBON OR CVD ORGANIC MATERIALS

BACKGROUND OF THE INVENTION

1. Field of the Invention

Embodiments of the invention pertain to semiconductor device fabrication, and in particular to spacers formed around gate structures.

2. Related Technology

Spacers are used for a number of purposes during MOSFET fabrication. FIGS. 1a and 1b illustrate one example in which a gate spacer is used to mask portions of MOSFET source and drain regions during implantation of shallow source and drain extensions. As shown in cross-section in FIG. 1a, a conventional MOSFET gate structure comprised of a gate line 10 and gate insulator 12 is formed on a semiconductor substrate 14. A low energy dopant implant is performed to form shallow source and drain extensions 16. Subsequently, a conformal layer of a conventional spacer material such as silicon oxide or silicon nitride is formed over the gate structure and surrounding regions, and is then anisotropically etched to leave a spacer 18 as shown in FIG. 1b. After the spacer is formed, a high energy dopant implant is performed to form deep source and drain regions 20. The spacer serves to mask the end portions of the shallow source and drain extensions 16 from further implantation.

FIG. 2 shows an example of a second type of spacer structure that is typically referred to as an "L-shaped" spacer. The L-shaped spacer is formed by initially forming a thin conformal layer of a conventional spacer material such as silicon oxide or silicon nitride over a gate structure. The L-shaped spacer is then patterned from the thin layer of spacer material using a photoresist mask as an etch mask during an anisotropic etch to remove unmasked portions. The resulting L-shaped spacer 22 has tail portions 24 that extend outward from the gate and protect a portion of the underlying source and drain regions. The L-shaped spacer may be used for protecting shallow source and drain extensions in the manner shown in FIGS. 1a and 1b. The L-shaped spacer is preferred in some applications because the tail portion may be implanted through to adjust the doping of underlying regions. The L-shaped spacer is also preferable in dense architectures because it occupies relatively little space around the gate and therefore leaves more room when depositing interlevel dielectric.

Irrespective of which type of spacer is used, the spacer is typically left in place during subsequent silicidation of the source and drain regions to prevent shorting between the gate line and the suicides of the source and drain regions.

The conventional spacer structures entail a number of disadvantages. One disadvantage is that the etches used to pattern the spacers may be destructive of the underlying substrate, necessitating the use of a thick protective layer if the spacer is to be removed. This limits the manner in which spacers are currently used. For example, while it would be advantageous to implant shallow source and drain extensions after annealing of deep source and drain regions so as to prevent diffusion of dopant from the shallow extensions into the substrate during annealing, to do so would require formation of the deep regions, followed by removal of the spacer, and then formation of the shallow regions. However, the etching required to remove the spacer consumes a portion of the substrate in which the deep source and drain regions are formed, and therefore alters the physical dimensions of the deep source and drain regions. Similarly, it may be desirable in some implementations to use a thick spacer for source and drain implantation and a thinner spacer during silicidation, but again the potential loss of substrate during removal of the first spacer makes such processing undesirable. In either instance, the additional processing required to form and later remove protective layers unduly complicates the fabrication process.

SUMMARY OF THE INVENTION

In view of the shortcomings of conventional spacer technology, there remains a need for spacers that are more easily fabricated and more easily removed.

In accordance with one embodiment of the invention, a multilayer L-shaped spacer is formed of a lower portion comprising a CVD organic material or amorphous carbon, and an upper portion comprised of a protective material. The upper portion is patterned using a photoresist mask. During that patterning, the underlying substrate is protected by a layer of CVD organic material or amorphous carbon. The CVD organic material or amorphous carbon is then patterned using the patterned protective material as a mask. The chemistry used to pattern the CVD organic material or amorphous carbon is relatively harmless to the underlying substrate.

A first preferred embodiment may be employed to manufacture a semiconductor device. Initially a substrate having formed thereon a gate structure including a gate insulator formed on the substrate and a gate line formed over the gate insulator is provided. A conformal layer of a spacer material is then formed over the substrate and the gate structure. The spacer material is one of amorphous carbon and a CVD organic material. A conformal layer of a protective material is then formed over the spacer material. The protective material is patterned using a photoresist mask to define an upper portion of an L-shaped spacer. The photoresist mask and spacer material unprotected by the upper portion of the L-shaped spacer are then removed to form a lower portion of the L-shaped spacer.

Implementations in accordance with the first embodiment are therefore typically characterized by a substrate having a gate insulator and a gate line formed on the gate insulator, and an L-shaped spacer formed on a sidewall of the gate line. The L-shaped spacer comprises a lower portion comprising one of a CVD organic material and amorphous carbon, and an upper portion comprising a protective material. A wide variety of protective materials may be employed. Preferred materials include silicon oxide, silicon oxynitride, TEOS oxide, silicon rich nitride, and silicon rich oxide.

In accordance with another embodiment of the invention, an L-shaped spacer is patterned without using a photoresist mask by forming an amorphous carbon spacer around a gate that is covered with a conformal layer of a conventional spacer material. The conventional spacer material is patterned using the amorphous carbon spacer as an etch mask. The amorphous carbon spacer is easily formed without the need for lithographic patterning, and therefore this method is preferable to methods using photoresist masks.

A second preferred embodiment may therefore be employed to manufacture a semiconductor device. Initially a substrate having formed thereon a gate structure including a gate insulator formed on the substrate and a gate line formed over the gate insulator is provided. A conformal layer of a spacer material is formed over the substrate and the gate structure. A conformal layer of amorphous carbon is then formed over the layer of spacer material. The amorphous carbon layer is anisotropically etched to form an amorphous carbon spacer around the gate structure, and the protective layer is then patterned using the amorphous carbon spacer as a hardmask to define an L-shaped spacer.

DESCRIPTION OF THE DRAWINGS

Embodiments of the invention are described in conjunction with the following drawings, in which.

DESCRIPTION OF PREFERRED EMBODIMENTS

First Embodiment

Figure 1A:
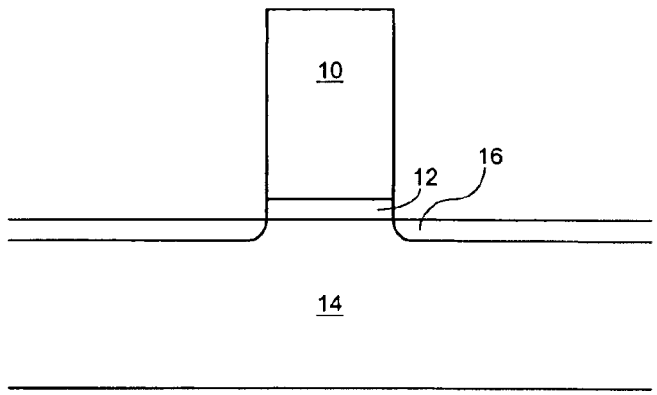
FIGS. 1a and 1b show structures formed in accordance with conventional processing.
Figure 1B:
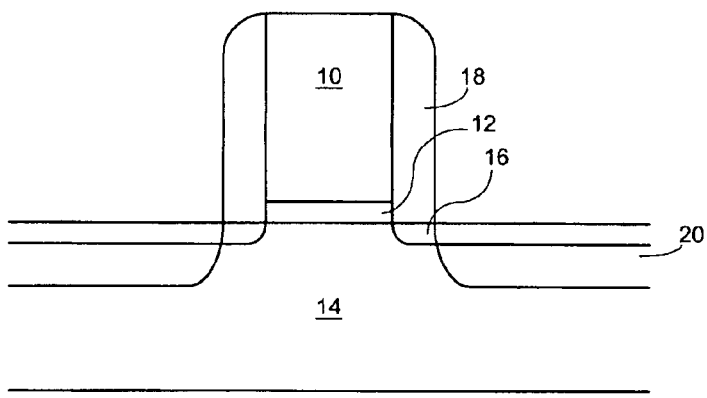
Figure 2:
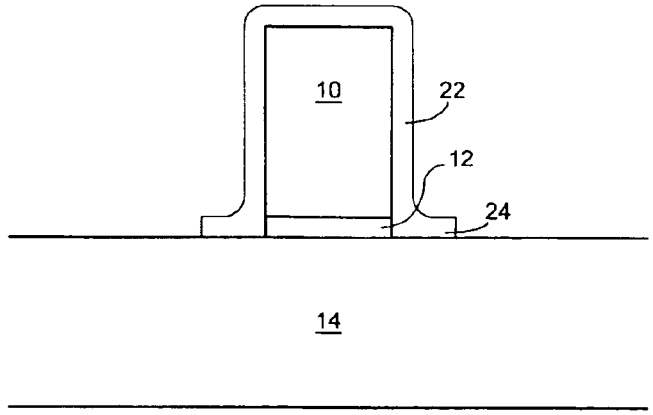
FIG. 2 shows a conventional L-shaped spacer.
Figure 3A:
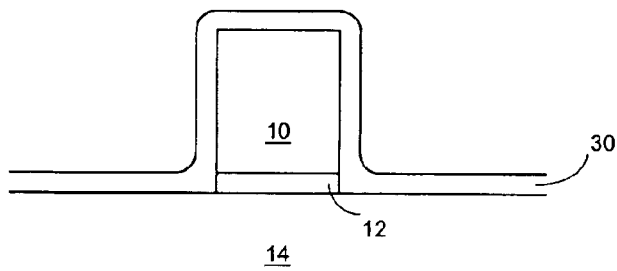
FIGS. 3a, 3b, 3c, 3d, 3e and 3f show structures formed during processing in accordance with a first preferred embodiment.

FIGS. 3a–3f shows structures formed during processing in accordance with a first embodiment that is preferred for forming a multilayer L-shaped spacer that includes a lower amorphous carbon or CVD organic layer. FIG. 3a shows a structure comprising semiconductor substrate 14 having formed thereon a gate structure including a gate insulator 12 and a gate line 10. A conformal layer 30 of a spacer material such as amorphous carbon or a CVD organic is formed over the substrate and the gate structure.

Figure 3B:
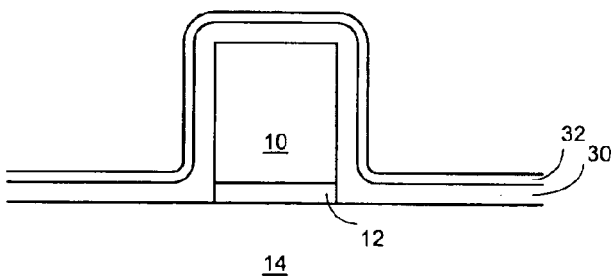

FIG. 3b shows the structure of FIG. 3a after formation of a conformal layer of a protective material 32 such as silicon oxide, silicon oxynitride, TEOS oxide, silicon rich nitride, or silicon rich oxide over the spacer material layer 30. The protective material 32 preferably provides antireflective properties.

Figure 3C:
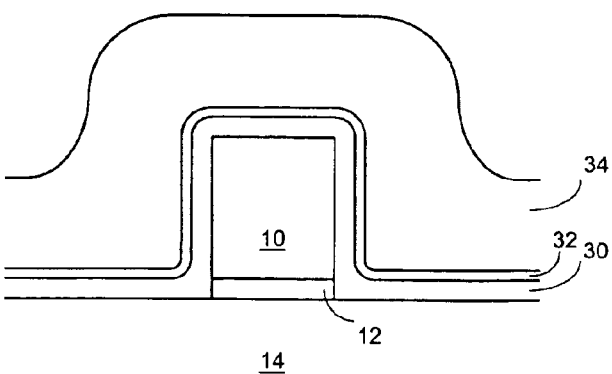

FIG. 3c shows the structure of FIG. 3b after formation of a layer of a photoresist material 34 over the protective material 32. The photoresist material is then patterned to form a photoresist mask 36 as shown in FIG. 3d.

Figure 3D:
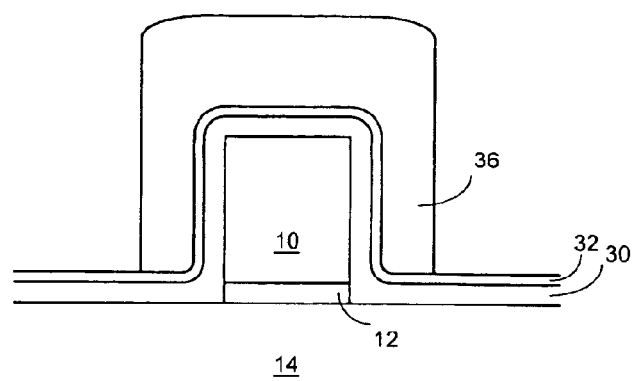
Figure 3E:
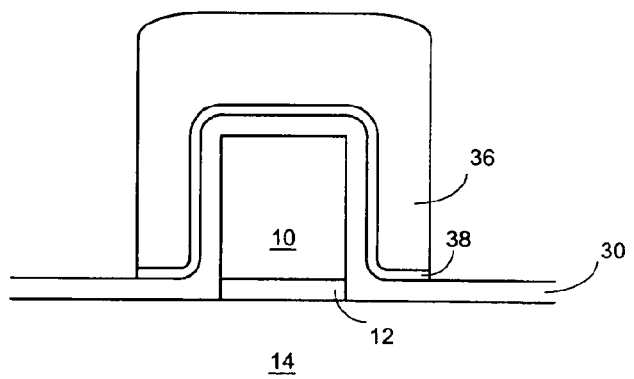

FIG. 3e shows the structure of FIG. 3d after patterning of the protective material layer 32 using the photoresist mask 36 as an etch mask. The structure resulting from patterning comprises the upper portion 38 of an L-shaped spacer. During the etch of the protective material layer 32, the underlying CVD organic or amorphous carbon layer protects the underlying substrate 14.

Figure 3F:
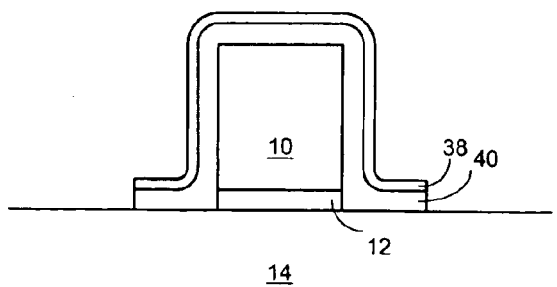

FIG. 3f shows the structure of FIG. 3e after removal of the photoresist mask and unprotected spacer material by a removal process such as a wet clean or an ashing process, using the upper portion 38 of the L-shaped spacer as a hardmask. Ashing may be performed, for example, using an atmosphere of oxygen or hydrogen. The removal of the photoresist may be removed concurrently with patterning of the lower layer. The resulting structure includes an L-shaped spacer comprising a lower organic or amorphous carbon spacer material portion 40 and an upper protective portion 38. The ashing process or wet clean process is relatively harmless to the material of the underlying substrate 14.

The L-shaped spacer of the first preferred embodiment is advantageously used as a protective spacer during high energy implant because the upper and lower portions 38, 40 of the L-shaped spacer that overly the gate line 10 provide protection for the gate line material during implantation. The L-shaped spacer of the preferred embodiment is preferred over L-shaped spacers formed entirely of a single layer of material because the lower CVD organic or amorphous carbon layer protects the substrate during patterning of the upper layer, and the effect on the substrate of the subsequent patterning of the lower CVD organic or amorphous carbon layer is relatively benign. The L-shaped spacer of the first embodiment may be used in CMOS fabrication as well as simple MOSFET fabrication, and may be employed for implantation masking and for short circuit protection during silicidation.

Implementations in accordance with the first embodiment are therefore typically characterized by a substrate having a gate insulator and a gate line formed on the gate insulator, and an L-shaped spacer formed on a sidewall of the gate line. The L-shaped spacer comprises a lower portion comprising one of a CVD organic material and amorphous carbon, and an upper portion comprising a protective material. A wide variety of protective materials may be employed. Preferred materials include silicon oxide, silicon oxynitride, TEOS oxide, silicon rich nitride, and silicon rich oxide.

Figure 4:
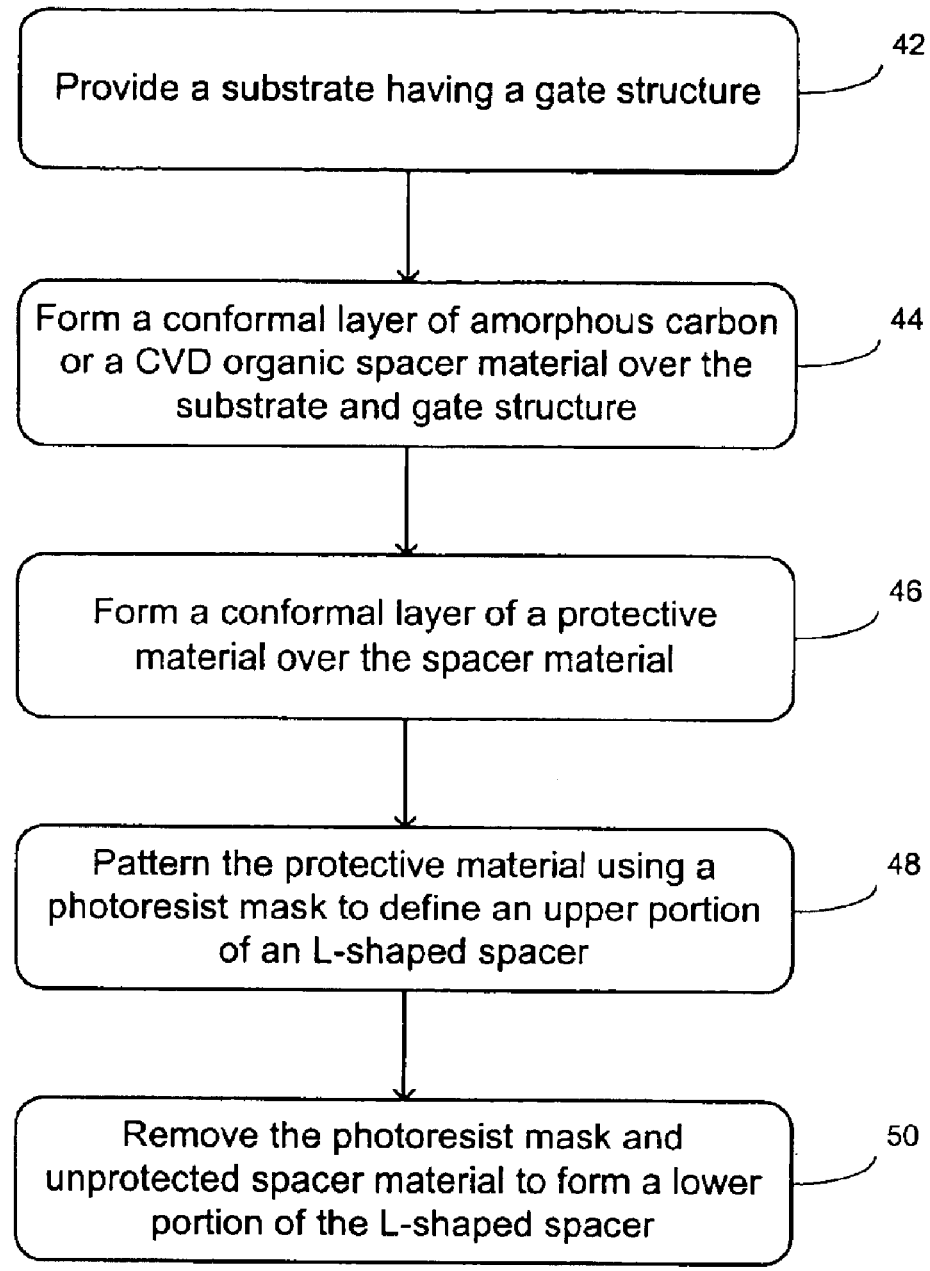
FIG. 4 shows a process flow encompassing the first preferred embodiment and alternative embodiments.

FIG. 4 shows a process flow encompassing the first preferred embodiment and various alternatives. Initially a substrate is provided (42). The substrate has formed thereon at least one gate structure including a gate insulator and a gate line. A conformal layer of a spacer material is then formed over the substrate and the gate (44). The spacer material is one of amorphous carbon and a CVD organic material. A conformal layer of a protective material is then formed over the spacer material (46). The protective material is then patterned using a photoresist mask to define an upper portion of an L-shaped spacer (48). The photoresist mask and spacer material that is unprotected by the upper portion of the L-shaped spacer are then removed, forming a lower portion of the L-shaped spacer (50).

The process flow of the second preferred embodiment may be employed in the fabrication of both MOSFETs and CMOS devices.

Second Embodiment

Figure 5A:
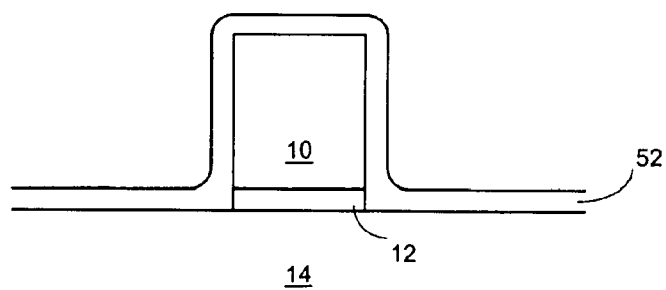
FIGS. 5a, 5b, 5c, 5d and 5e show structures formed during processing in accordance with a second preferred embodiment.

FIGS. 5a–5e show structures formed during processing in accordance with a second preferred embodiment in which an amorphous carbon spacer is used for patterning an L-shaped spacer. FIG. 5a shows a MOSFET gate structure including a gate line 10 and gate insulator 12 formed on a semiconductor substrate 14. A conformal layer of a conventional spacer material 52 such as silicon oxide, silicon oxynitride, TEOS oxide, silicon rich nitride, or silicon rich oxide is formed over the substrate 14 and the gate structure.

Figure 5B:
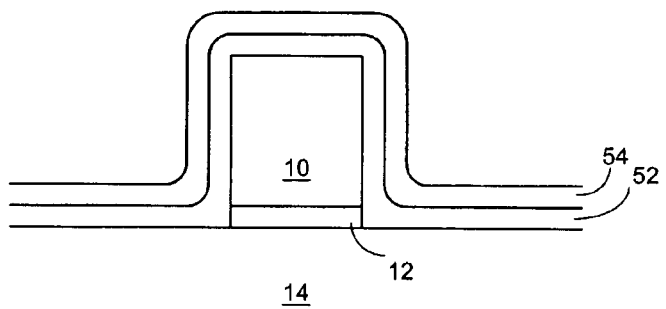

FIG. 5b shows the structure of FIG. 5a after formation of a conformal layer of amorphous carbon 54 over the layer of spacer material 52. The structure of FIG. 5b is subsequently exposed to an anisotropic etch using a chemistry such as $HBr/O_2/Ar$, $Cl_2/O_2/N_2$ or $Ar/O_2/N_2$ to form an amorphous carbon spacer 56 surrounding the gate structure as shown in FIG. 5c.

Figure 5C:
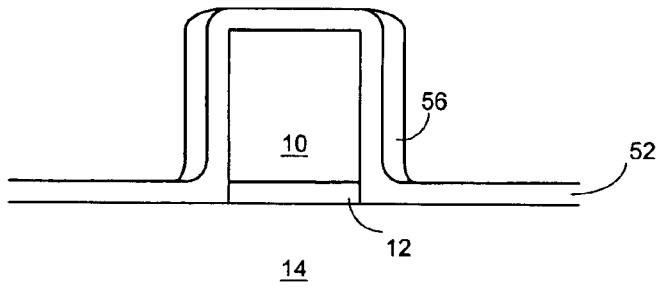
Figure 5D:
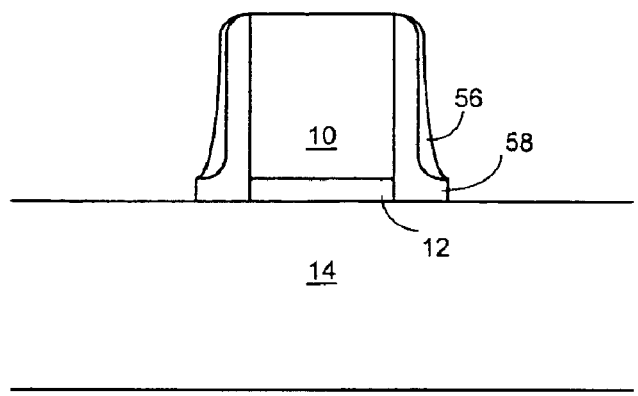

FIG. 5d shows the structure of FIG. 5c after anisotropically etching the layer of spacer material 52 using the amorphous carbon spacer 56 as a hardmask. The spacer material is thereby patterned to form an L-shaped spacer 58. Since this patterning does not involve masking of the protective layer by photolithographic techniques, fabrication is simple and accurate. It may be seen that the length of the tail portions of the spacer 58 depends on the thickness of the amorphous carbon spacer 56, and hence on the thickness of the amorphous carbon layer from which the spacer 56 is formed.

Figure 5E:
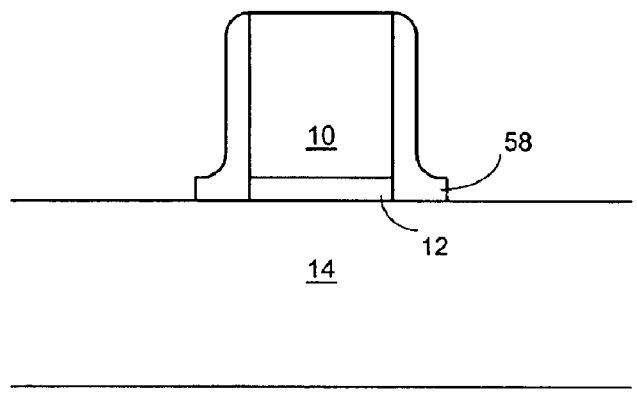

FIG. 5e shows the structure of FIG. 5d after removal of the amorphous carbon spacer by an ashing process to leave the L-shaped spacer 58. The resulting L-shaped spacer may be used in subsequent processing as an implant mask during formation of deep source and drain regions, or for protection of the gate during silicide formation.

Figure 6:
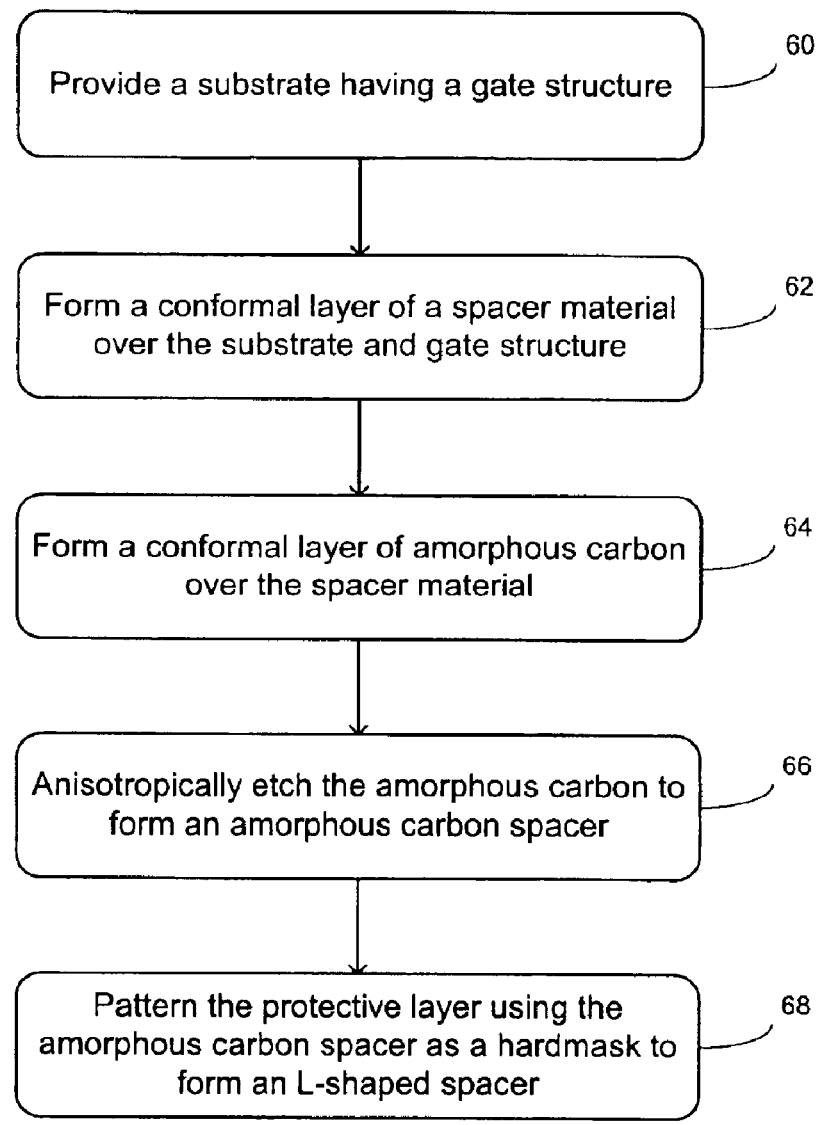
FIG. 6 shows a process flow encompassing the second preferred embodiment and alternative embodiments.

FIG. 6 shows a process flow encompassing the second preferred embodiment and various alternatives. Initially a substrate is provided (60). The substrate has formed thereon at least one gate structure including a gate insulator and a gate line. A conformal layer of a spacer material is then formed over the substrate and the gate (62). The spacer material is typically silicon oxide or silicon nitride. A conformal layer of amorphous carbon is then formed over the spacer material (64). The amorphous carbon layer is anisotropically etched to form an amorphous carbon spacer around the gate structure (66), and the protective layer is then patterned using the amorphous carbon spacer as a hardmask to define an L-shaped spacer (68). The amorphous carbon spacer may then be removed, such as by an ashing process or a photoresist wet clean process.

The L-shaped spacer formed as described above may be used for a variety of purposes such as masking during implantation of deep source and drain regions and preventing shorts between gate lines and source and drain silicides, and may be used in both MOSFET and CMOS fabrication.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of claimed inventions and their equivalents.

What is claimed is:

1. A process performed during manufacture of a semiconductor device, comprising:

providing a substrate having formed thereon a gate structure including a gate insulator formed on the substrate and a gate line formed over the gate insulator;

forming a conformal layer of a spacer material over the substrate and the gate structure, the spacer material being one of amorphous carbon and a CVD organic material;

forming a conformal layer of a protective material over the spacer material;

patterning the protective material using a photoresist mask to define an upper portion of an L-shaped spacer; and removing the photoresist mask and spacer material unprotected by the upper portion of the L-shaped spacer to form a lower portion of the L-shaped spacer.

2. The method claimed in claim 1, wherein the protective material is one of silicon oxide, silicon oxynitride, TEOS oxide, silicon rich nitride, and silicon rich oxide.

3. The method claimed in claim 1, further comprising implanting deep portions of the source and drain regions adjacent to the gate structure using the L-shaped spacer as an implant mask.

4. The method claimed in claim 1, further comprising forming silicided source and drain contacts for source and drain regions adjacent to said gate structure, wherein the L-shaped spacer prevents shorting of the silicided source and drain contacts to the gate line.

5. The method claimed in claim 1, wherein said removing is performed using an ashing process.

6. The method claimed in claim 1, wherein said removing is performed using a photoresist wet clean process.

7. A process performed during manufacture of a semiconductor device, comprising:

providing a substrate having formed thereon a gate structure including a gate insulator formed on the substrate and a gate line formed over the gate insulator;

forming a conformal layer of a spacer material over the substrate and the gate structure;

forming a conformal layer of amorphous carbon over the layer of spacer material;

anisotropically etching the amorphous carbon layer to form an amorphous carbon spacer around the gate structure; and patterning the protective layer using the amorphous carbon spacer as a hardmask to define an L-shaped spacer.

8. The method claim 7, wherein the spacer material is one of silicon oxide, silicon oxynitride, TEOS oxide, silicon rich nitride, and silicon rich oxide.

9. The method claimed in claim 7, further comprising removing the amorphous carbon spacer.

10. The method claimed in claim 9, wherein said removing is performed using an ashing process.

11. The method claimed in claim 9, wherein said removing is performed using a photoresist wet clean process.

12. The method claimed in claim 7, further comprising implanting deep portions of the source and drain regions adjacent to the gate structure using the L-shaped spacer as an implant mask.

13. The method claimed in claim 7, further comprising forming silicided source and drain contacts for source and drain regions adjacent to said gate structure, wherein the L-shaped spacer prevents shorting of the silicided source and drain contacts to the gate line.

14. The method claimed in claim 1, wherein patterning the protective material defines an L-shaped upper portion of the L-shaped spacer, and wherein removing the spacer material unprotected by the upper portion of the L-shaped spacer forms a lower L-shaped portion of the L-shaped spacer.

15. The method claimed in claim 1, wherein the L-shaped spacer extends over a top surface of the gate line.

16. The method claimed in claim 1, wherein the photoresist mask and the unprotected spacer material are removed concurrently.

* * * * *